(12) United States Patent
Honda

(10) Patent No.: US 8,545,671 B2
(45) Date of Patent: Oct. 1, 2013

(54) PLASMA PROCESSING METHOD AND PLASMA PROCESSING APPARATUS

(75) Inventor: Masanobu Honda, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 260 days.

(21) Appl. No.: 13/076,907

(22) Filed: Mar. 31, 2011

(65) Prior Publication Data

US 2011/0240599 A1 Oct. 6, 2011

Related U.S. Application Data

(60) Provisional application No. 61/327,122, filed on Apr. 23, 2010.

(30) Foreign Application Priority Data

Mar. 31, 2010 (JP) .................................. 2010-082918

(51) Int. Cl.
*C23F 1/00* (2006.01)
*H01L 21/306* (2006.01)
*C23C 16/00* (2006.01)

(52) U.S. Cl.
USPC .................................. 156/345.44; 118/723 E

(58) Field of Classification Search
USPC ............... 156/345.43–345.47; 118/715, 722, 118/723 R, 723 E; 315/111.21
See application file for complete search history.

(56) References Cited

U.S. PATENT DOCUMENTS

2006/0219363 A1* 10/2006 Matsumoto et al. ..... 156/345.47

FOREIGN PATENT DOCUMENTS

| CN | 1984523 A | 6/2007 |
|---|---|---|
| CN | 101022693 A | 8/2007 |
| CN | 101515545 A | 8/2009 |
| CN | 101546685 A | 9/2009 |
| JP | 8-22980 | 1/1996 |

* cited by examiner

*Primary Examiner* — Maureen Gramaglia
(74) *Attorney, Agent, or Firm* — Rothwell, Figg, Ernst & Manbeck, P.C.

(57) ABSTRACT

A plasma processing apparatus for generating a plasma in a plasma processing space in a processing chamber and plasma-processing a target object includes a plasma-exciting high frequency power supply for applying a plasma-exciting high frequency power. Further, the plasma processing apparatus includes at least one of a potential-controlling high frequency power supply for applying a potential-controlling high frequency power having a frequency lower than that of the plasma-exciting high frequency power and a DC power supply for applying a DC voltage; and a mounting table for mounting thereon a target object. Furthermore, the plasma processing apparatus includes an auxiliary electrode, provided at a position outer side of the target object mounted on the mounting table while facing the mounting table, connected to at least one of the potential-controlling high frequency power supply and the DC power supply.

6 Claims, 6 Drawing Sheets

PLASMA PROCESSING METHOD AND PLASMA PROCESSING APPARATUS

CROSS-REFERENCE TO RELATED APPLICATIONS

This application claims priorities to Japanese Patent Application No. 2010-082918 filed on Mar. 31, 2010 and U.S. Provisional Application No. 61/327,122 filed on Apr. 23, 2010, the entire contents of which are incorporated herein by reference.

FIELD OF THE INVENTION

The present invention relates to a plasma processing method and a plasma processing apparatus for performing plasma process on a target object; and, more particularly, to a mechanism for controlling a wall potential.

BACKGROUND OF THE INVENTION

A plasma potential is higher than its surrounding potential. This will be explained by using as an example a parallel plate type plasma processing apparatus 99 shown in FIG. 8. In a plasma processing space in a processing chamber 900, when a bias potential is negative (negative wafer potential), i.e., when a wafer potential $V_{wafer}$ is lower than a wall potential $V_{wall}$ (i.e., ground), a plasma potential $V_{plasma}$ becomes higher than the wall potential $V_{wall}$. Meanwhile, when a bias potential is positive (positive wafer potential), i.e., when the wafer potential $V_{wafer}$ is higher than the wall potential $V_{wall}$, the plasma potential $V_{plasma}$ becomes higher than the wafer potential $V_{wafer}$.

A potential difference between the wall of the processing chamber 900 and a plasma ($V_{wall}-V_{plasma}$) greatly affects productivity of an etching process. In other words, if the potential difference ($V_{wall}-V_{plasma}$) is too large, a sputtering force of ions in the plasma on the wall surface is increased, and radicals in the plasma may not be deposited easily on the wall surface. Therefore, the wall of the processing chamber is eroded, and this causes production of particles, contamination in the chamber, erosion of components or the like.

On the other hand, if the potential difference ($V_{wall}-V_{plasma}$) is too small, a sputtering force of ions in the plasma on the wall surface is decreased, and radicals in the plasma are easily deposited on the wall surface. Thus, reaction products are deposited on the wall, which leads to formation of a film. For example, when a process using a CF-based gas has been performed in a previous process, a CF film (polymer) is formed on the wall surface of the processing chamber during the process. In that state, if a process using $O_2$ gas is performed in the same processing chamber in a next process, a plasma is generated in a state where $O_2$ and CF are mixed. Hence, components of the CF film adhered to the wall surface enter the plasma and react chemically with other substances, thereby inflicting adverse effects on a desired plasma process. This is a so-called memory effect problem. In addition to the memory effect problem, there is generated another problem in which the inside of the processing chamber needs to be cleaned frequently as the amount of the film adhered to the wall is increased. This leads to a decrease in the productivity and an increase in the manufacturing cost.

Recently, due to a growing user's demand to improve a throughput, processing time is shortened by increasing an etching rate or the like. In order to meet this demand, a high frequency power of a higher level needs to be supplied into the processing chamber. When the high frequency power of a higher level is outputted from the high frequency power supply, a sputtering force on the wall surface is increased, and radicals are not easily deposited on the wall surface. Therefore, the erosion amount of the wall is increased.

Japanese Patent Application Publication No. H8-22980, discloses that during a plasma process, a high frequency bias power is applied to a lower electrode and ions are attracted to the lower electrode. When cleaning is required due to deposits accumulated on an upper electrode or an inner wall of the processing chamber during the plasma process, a switch is switched such that the upper electrode is biased with a negative voltage, thereby applying the high frequency power to the upper electrode and attracting the ions toward the upper electrode. Due to the attraction of the ions, the deposits accumulated on the upper electrode can be removed.

Japanese Patent Application Publication No. H8-22980 suggests a technique for switching a supply destination of the high frequency bias power between the plasma process and the cleaning process. However, this technique cannot be used to solve the problem in which the wall is eroded or the film is formed on the wall during the plasma process.

To that end, it is considered to control the high frequency power such that the excessive erosion of the wall and the excessive deposition of the film on the wall can be prevented. This is because the potential difference between the wall of the processing chamber and the plasma ($V_{wall}-V_{plasma}$) generally depends on the high frequency power supplied to the electrode.

However, the high frequency power needs to be set to an optimal level in order to generate a plasma. Thus, the potential applied to the wall is not actively controlled, and is determined in accordance with the level of the high frequency power or the shape of the processing chamber.

When different processes are consecutively performed in a same processing chamber, the respective processes have different optimal high frequency power levels and, thus, it is extremely difficult to control the potential difference between the wall of the processing chamber and the plasma to be within a desired range under all the process conditions. Hence, the processing chamber is designed to have a structure that enables the potential difference between the wall and the plasma to be optimal for a representative high frequency power. However, the recent mainstream is batch etching of a multilayer structure in which a plurality of different etching processes is consecutively performed on a multilayer structure in the same processing chamber. Accordingly, the process requiring an extremely high power condition and that requiring an extremely low power condition need to be consecutively performed in the same processing chamber. This causes an excessive increase or decrease of the potential difference between the wall and the plasma ($V_{wall}-V_{plasma}$), which results in an erosion of the wall or the deposition of the film on the wall.

SUMMARY OF THE INVENTION

In view of the above, the present invention provides a plasma processing method and a plasma processing apparatus capable of properly controlling a wall potential in accordance with processes while maintaining a plasma in a stable state.

In accordance with a first aspect of the present invention, there is provided a plasma processing apparatus for generating a plasma in a plasma processing space in a processing chamber and plasma-processing a target object. The plasma processing apparatus includes a plasma-exciting high frequency power supply for applying a plasma-exciting high frequency power. Further, the plasma processing apparatus includes at least one of a potential-controlling high frequency power supply for applying a potential-controlling high frequency power having a frequency lower than that of the plasma-exciting high frequency power and a DC power supply for applying a DC voltage. Furthermore, the plasma processing apparatus includes a mounting table for mounting thereon the target object; and an auxiliary electrode, provided at a position outer side of the target object mounted on the mounting table while facing the mounting table, the auxiliary electrode being connected to at least one of the potential-controlling high frequency power supply and the DC power supply.

With the above configuration, the auxiliary electrode connected to at least one of the high frequency power supply and the DC power supply is provided at a position outer side of the target object mounted on the mounting table while facing the mounting table. Accordingly, at least one of the high frequency power outputted from the high frequency power supply and the DC voltage outputted from the DC power supply is applied to the auxiliary electrode.

From the above, the inventors of the present invention have found that the potential difference between the wall of the processing chamber and the plasma ($V_{wall}-V_{plasma}$) is decreased when the DC voltage outputted from the DC power supply is applied to the auxiliary electrode, and is increased when the high frequency power outputted from the high frequency power supply is applied to the auxiliary electrode.

Hence, in the process in which the reaction products are easily deposited on the wall, the high frequency power outputted from the high frequency power supply is applied to the auxiliary electrode. Thus, the potential difference between the wall of the processing chamber and the plasma ($V_{wall}-V_{plasma}$) is increased, and a sheath voltage of the wall surface side is increased. This facilitates the acceleration of the ions in the sheath region of the wall surface side and increases the collision force of the ions with the wall. As a result, the deposition of the reaction products on the wall can be suppressed.

Meanwhile, in the process in which the wall is easily eroded, the DC voltage outputted from the DC power supply is applied to the auxiliary electrode. Hence, the potential difference between the wall of the processing chamber and the plasma ($V_{wall}-V_{plasma}$) is decreased, and a sheath voltage of the wall surface side is decreased. This decreases the acceleration of the ions in the sheath region of the wall surface side and decreases the collision force of the ions with the wall. As a consequence, the erosion of the wall can be suppressed. The above configuration makes it possible to prevent the excessive erosion of the wall and the excessive deposition of the deposits on the wall in the processing chamber.

In the above configuration, the potential-controlling high frequency power having a frequency lower than that of the plasma-exciting high frequency power is used, whereas the plasma-generating high frequency power is not used for the control of the wall potential. Therefore, the plasma-generating high frequency power can be set to a proper level in accordance with processes, and this allows the plasma to be maintained in a stable state. Further, in the above configuration, the auxiliary electrode is provided at a position located outer side of the target object while facing the mounting table. Accordingly, the wall potential control and the plasma generation control are separately carried out without affecting each other. As a result, the wall potential can be properly controlled while maintaining the plasma in a stable state.

In accordance with a second aspect of the present invention, there is provided a plasma processing method using a plasma processing apparatus for generating a plasma in a plasma processing space by applying a plasma-exciting high frequency power. The plasma processing apparatus includes at least one of a potential-controlling high frequency power supply for applying a potential-controlling high frequency power having a frequency lower than a frequency of the plasma-exciting high frequency power and a DC power supply for applying a DC voltage. Further, the plasma processing apparatus includes an auxiliary electrode provided at a position outer side of the target object mounted on the mounting table while facing the mounting table, the auxiliary electrode being connected to at least one of the potential-controlling high frequency power supply and the DC power supply. Further, the method includes applying a high frequency power from the potential-controlling high frequency power supply or a DC voltage from the DC power supply to the auxiliary electrode in accordance with process conditions.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENT

Figure 1:
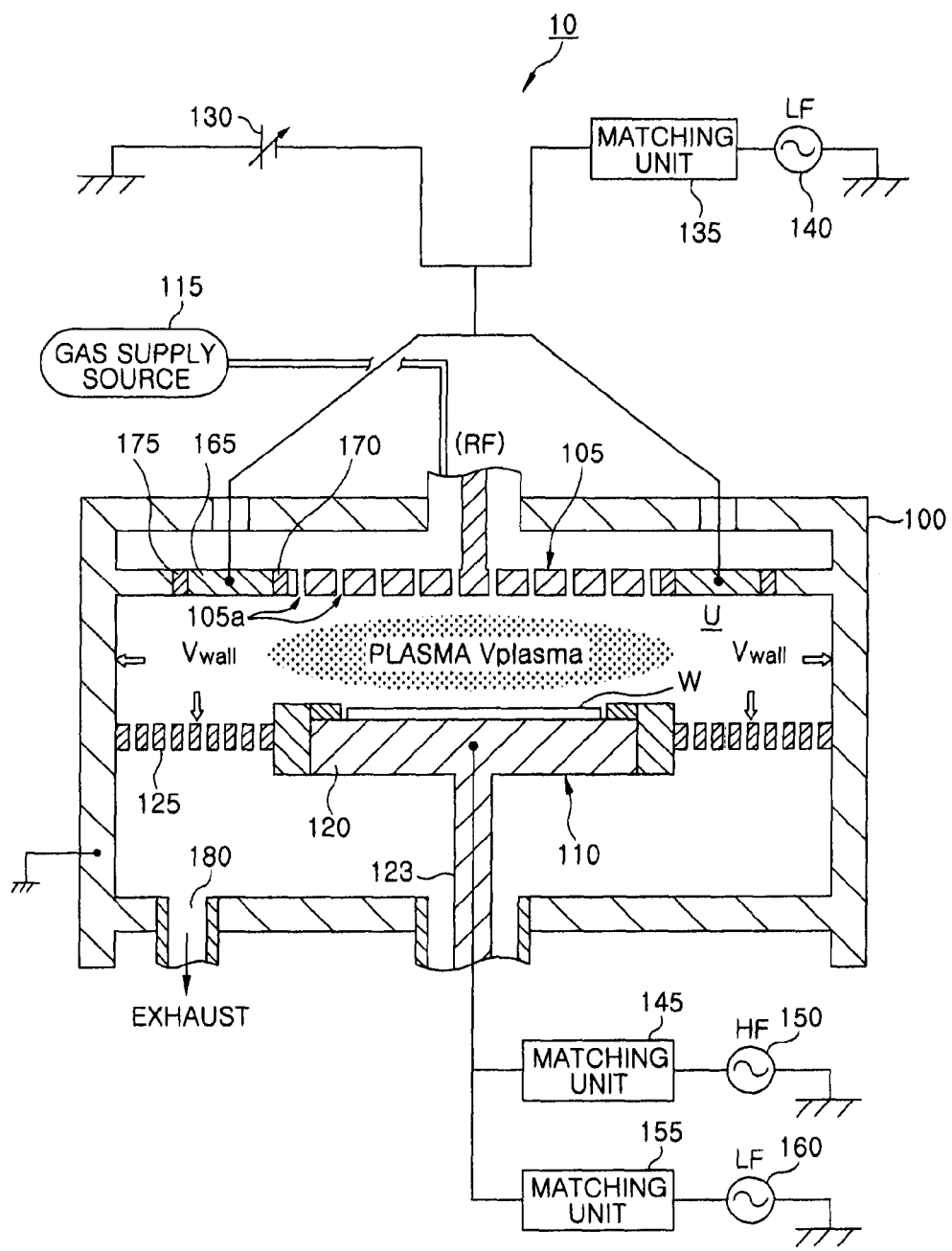
FIG. 1 is a vertical cross sectional view showing an entire configuration of an etching apparatus in accordance with a first embodiment of the present invention.

Embodiments of the present invention will be described with reference to the accompanying drawings which form a part hereof. Throughout this specification and the drawings, like reference numerals designate like parts having substantially identical functions, and redundant description thereof will be omitted.

First Embodiment (Entire Configuration of Plasma Processing Apparatus)

First of all, an entire configuration of a plasma processing apparatus in accordance with a first embodiment of the present invention will be described with reference to FIG. 1. FIG. 1 is a cross sectional view schematically showing a capacitively coupled (parallel plate type) etching apparatus in accordance with the present embodiment of the present invention. An etching apparatus 10 is an example of a plasma processing apparatus for plasma-processing a target object in a processing chamber.

The etching apparatus 10 includes a processing chamber 100 for plasma-processing a wafer W. The processing chamber 100 has a cylindrical shape and is grounded. The processing chamber 100 includes, e.g., a member obtained by thermally spraying an insulating material on an aluminum base, or a member obtained by coating silicon carbide on a silicon or an aluminum base.

An upper electrode 105 and a lower electrode 110 are disposed in the processing chamber 100 to face each other, and form a pair of parallel plate electrodes. The upper electrode 105 is made of silicon or aluminum thermally sprayed with alumina or yttrium oxide. A plurality of gas holes 105a penetrates through the upper electrode 105, and a gas supplied from a gas supply source 115 is introduced into the processing chamber through the gas holes 105a.

A mounting table 120 for mounting thereon a wafer W is provided at the lower electrode 110. The mounting table 120 is made of metal such as aluminum or the like and supported by a support member 123 via an insulator (not shown). Accordingly, the lower electrode 110 is in an electrically floating state. A baffle plate 125 having thin holes therethrough is provided around an outer periphery of the mounting table 120 to thereby control a gas flow. The baffle plate 125 is grounded.

An annular auxiliary electrode 165 is installed around the outer periphery of the upper electrode 105. The auxiliary electrode 165 is made of metal or a silicon containing material. When the auxiliary electrode 165 is made of metal, alumina or yttrium oxide is thermally sprayed on the surface thereof. The auxiliary electrode 165 is insulated from the upper electrode 105 and the processing chamber 100 by insulation members 170 and 175. Hence, the auxiliary electrode 165 is arranged around the outer periphery of the upper electrode 105 to be separated from the upper electrode 105 with the insulation member 170 therebetween. Further, the auxiliary electrode 165 is provided at a position located outside of the wafer W while facing the mounting table 120, and thus does not affect the generated plasma (bulk plasma).

A variable DC power supply (hereinafter, referred to as a DC power supply 130) is connected to the auxiliary electrode 165 and applies a DC current to the auxiliary electrode 165. Moreover, a potential-controlling high frequency power supply 140 is connected to the auxiliary electrode 165 via a matching unit 135, and applies to the auxiliary electrode 165 a potential-controlling high frequency power (LF power) having a frequency within a range from 300 kHz to 13.56 MHz which is lower than that of a plasma-exciting high frequency power.

The high frequency power of 13.56 MHz or less and the DC voltage do not contribute to the plasma generation. Thus, the high frequency power and the DC voltage respectively applied from the potential-controlling high frequency power supply 140 and the DC power supply 130 to the auxiliary electrode 165 only contribute to the ion attraction or the wall potential control. Hence, the potential difference between the wall of the processing chamber and the plasma ($V_{wall}$–$V_{plasma}$) can be controlled by the DC power supply 130 and the potential-controlling high frequency power 140 without changing the plasma generated in the processing chamber. As a result, it is possible to prevent excessive adhesion of a film to the upper electrode 105 or the wall of the processing chamber 100 and excessive erosion of the surface of the upper electrode 105 or the processing chamber 100.

In the present embodiment, the auxiliary electrode 165 is connected to both of the DC power supply 130 and the potential-controlling high frequency power supply 140. However, it may be connected to at least one of the DC power supply 130 and the potential-controlling high frequency power supply 140.

A plasma-exciting high frequency power supply 150 is connected to the lower electrode 110 via a matching unit 145. The plasma-exciting high frequency power supply 150 outputs a plasma-generating high frequency power (HF power) having a frequency higher than 13.56 MHz or above. Here, a high frequency of 60 MHz is outputted from the plasma-exciting high frequency power supply 150. The gas supplied from the gas supply source 115 is excited by the electric field energy of the high frequency power outputted from the plasma-exciting high frequency power supply 150, thereby generating a plasma in a plasma processing space U. The wafer W is etched by the plasma generated in the plasma processing space U. The plasma processing space U is surrounded by the inner wall of the processing chamber 100, the baffle plate 125 and the mounting table 120.

A high frequency bias power supply 160 is connected to the lower electrode 110 via a matching unit 155. The high frequency bias power supply 160 outputs a high frequency bias power (LF power) having a frequency within a range from 300 kHz to 13.56 MHz that is lower than that of the plasma-exciting high frequency power. By applying a bias voltage to the mounting table 120, the ions in the plasma are attracted toward the mounting table 120.

The high frequency power outputted from the plasma-exciting high frequency power supply 150 is preferably of a frequency higher than 13.56 MHz, and may be, e.g., 40 MHz, 60 MHz, or 100 MHz. Besides, the high frequency power outputted from the high frequency bias power supply 160 is preferably of a frequency lower than or equal to 13.56 MHz, and may be, e.g., 800 kHz, 2 MHz, or 3 MHz.

A gas exhaust port 180 is provided at a bottom surface of the processing chamber 100. The inside of the processing chamber 100 is evacuated by a gas exhaust unit (not shown) connected to the gas exhaust port 180 and maintained in a desired vacuum state.

(Supply of DC Power and LF Power to Auxiliary Electrode)

Hereinafter, the supply of DC and LF to the auxiliary electrode 165 in the etching apparatus 10 configured as described above will be explained in detail.

The recent mainstream is batch etching in which a plurality of different etching processes is consecutively performed on a multilayer structure in a same processing chamber. Thus, a step requiring an extremely low power condition and a step requiring an extremely high power condition need to be consecutively performed in a single processing chamber. This causes an excessive increase or decrease in a potential difference between the wall and the plasma ($V_{wall}$–$V_{plasma}$), which results in an erosion of the wall or a deposition of the film on the wall.

In view of the above, the present inventors have found that the potential difference between the wall of the processing chamber 100 and the plasma ($V_{wall}$–$V_{plasma}$) is decreased when the DC voltage outputted from the DC power supply 130 is applied to the auxiliary electrode 165 and is increased when the high frequency power outputted from the potential-controlling high frequency power supply 140 is applied to the auxiliary electrode 165.

Furthermore, in the process in which reaction products are easily deposited on the wall, the high frequency power outputted from the potential-controlling high frequency power supply 140 is applied to the auxiliary electrode 165. Accordingly, the potential difference between the wall of the processing chamber and the plasma ($V_{wall}$–$V_{plasma}$) is increased, and the sheath voltage of the wall surface side is increased. This facilitates the acceleration of the ions in the sheath region of the wall surface side and increases the collision force of the ions with the wall. Hence, the deposition of reaction products on the wall can be suppressed.

Meanwhile, in the process in which the wall is easily eroded, a DC voltage outputted from the DC power supply 130 is applied to the auxiliary electrode 165. Therefore, the potential difference between the wall of the processing chamber and the plasma ($V_{wall}-V_{plasma}$) is decreased, and the sheath voltage of the wall surface side is decreased. This decreases the acceleration of the ions in the sheath region of the wall surface side and decreases the collision force of the ions with the wall. As a consequence, the erosion of the wall can be suppressed. This configuration makes it possible to prevent excessive erosion of the wall and excessive deposition of deposits on the wall in the processing chamber. This theory will be described with reference to FIGS. 2 and 3.

Figure 2:
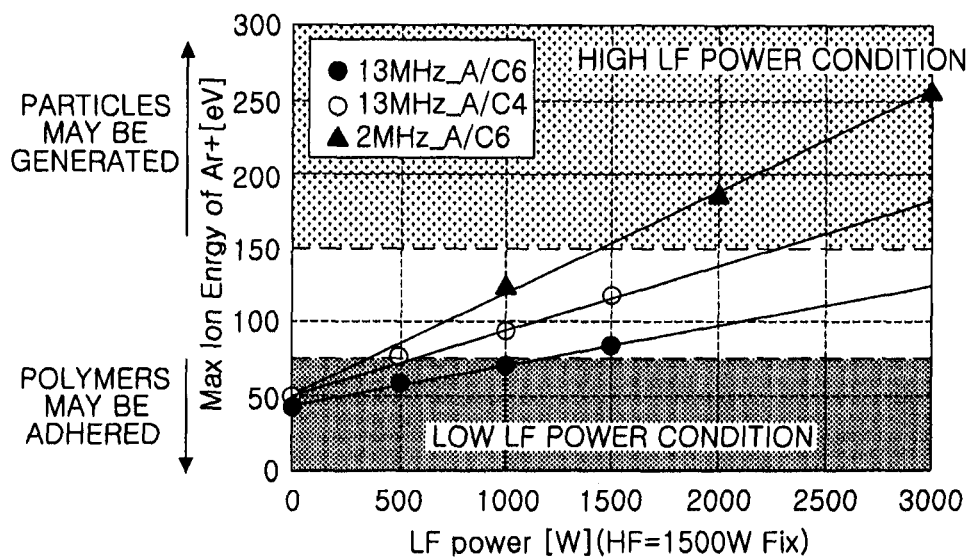
FIG. 2 is a graph showing a relationship between an LF power and an ion energy.

FIG. 2 shows a particle generation state and a polymer adhesion state, wherein the vertical axis represents a maximum energy of Ar ions $Ar^+$ in the plasma and the horizontal axis represents a high frequency bias power (LF power) applied to the lower electrode which is varied while fixing a plasma-exciting high frequency power (HF power) applied to the lower electrode to about 1500 W. A high frequency bias power which has a frequency lower than or equal to 13.56 MHz and does not contribute to the plasma generation is outputted from the high frequency bias power supply. Linear lines on the graph indicate the case in which a frequency of the high frequency bias power is about 2 MHz and a ratio of A/C is about 6, the case in which a frequency of the high frequency bias power is about 13 MHz and a ratio of A/C is about 4, and the case in which a frequency of the high frequency bias power is about 13 MHz and the ratio of A/C is about 6, respectively. Here, the ratio of A/C represents asymmetry between an anode electrode and a cathode electrode. For example, the ratio of A/C represents a ratio of an area of the wall (anode) to an area of the wafer (cathode).

This graph shows that when the maximum energy of the ions is higher than or equal to about 150 [eV], particles may be generated by the erosion of the wall and also that when the maximum energy of the ions is lower than or equal to about 75 [eV], polymers may be adhered to the wall. However, under any conditions, it is not possible to control the maximum energy of the ions to be maintained at a level between about 75 [eV] and 150 [eV] in the processes of the consecutive steps.

Here, the comparison among the three linear lines on the graph shows that, in all cases, when the LF power is increased, the sputtering force is increased and the wall is easily eroded. Thus, it is clear that the wall potential is increased and the sputtering force is increased when the LF power is applied from the high frequency bias power supply, compared to when the LF power is not applied from the high frequency bias power supply. In order to prevent the adhesion of the film to the wall, it is preferable to apply the LF power of the high frequency power supply.

In the above description and FIG. 2, the relationship between the high frequency bias power applied to the lower electrode and the sputtering force has been described. However, even when a high frequency power of the same frequency is applied to a different member, the relationship between the high frequency power and the sputtering force can be obtained by the same theory.

Figure 3:
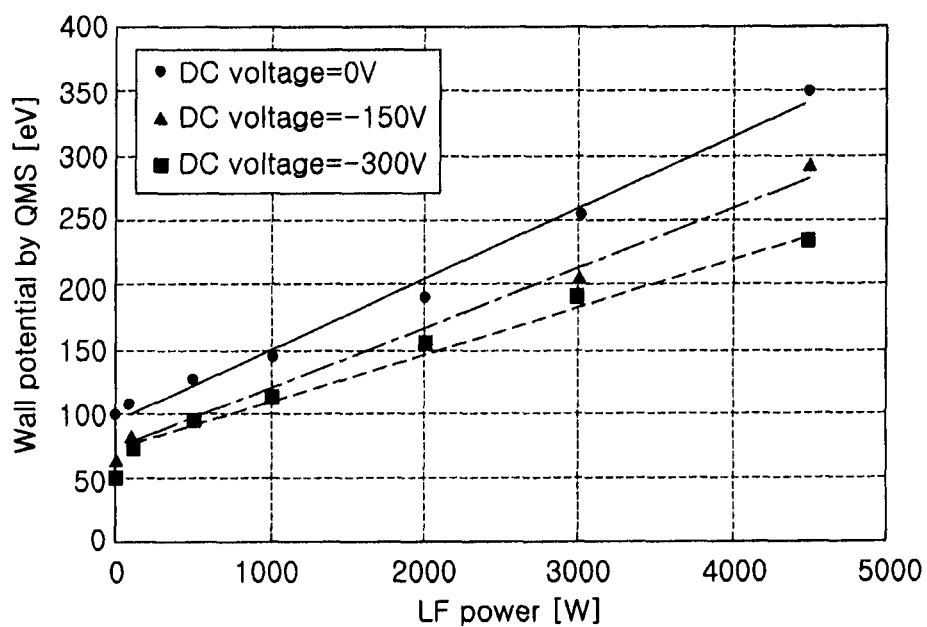
FIG. 3 is a graph showing a relationship between a DC voltage and a potential of a wall.

FIG. 3 shows relationships between DC voltages and a wall potential in the cases of applying the DC voltages of about 0 V, −150 V, and −300 RV to the upper electrode 105. In FIG. 3, the horizontal axis indicates variation of a high frequency bias power (LF power) applied to the lower electrode 110, and the vertical axis represents a wall potential obtained in the case of varying the LF power. The process conditions at this time are set as follows: a pressure is about 30 mT; a gaseous mixture of $C_4F_6$ gas/$O_2$ gas/Ar gas has a flow rate ratio of about 70/70/200 sccm; and a high frequency power has a frequency of 40 MHz and a power of about 1500 W.

As can be seen from the three linear lines in FIG. 3, when the DC voltages are applied (−150 V and −300 V), the wall potential is decreased compared to when the DC voltages are not applied (0 V). In order to prevent the erosion of the wall, it is preferable to apply the DC voltages to the upper electrode.

In the above description and FIG. 3, the relationship between the DC voltages applied to the upper electrode 105 and the wall potential has been described. However, even when the DC voltages are applied to a different member, the relationship between the DC voltages and the wall potential can be obtained by the same theory.

The plasma is mainly generated above the wafer W by the high frequency power (HF power) applied to the lower electrode 110. Thus, in the present embodiment, the auxiliary electrode 165 is provided at a position near the outer periphery of the upper electrode 105 and outer side of the wafer W, as described above. Accordingly, it is possible to control only the wall potential by the LF power or the DC voltage applied to the auxiliary electrode 165 without affecting the plasma generation by the application of the HF power to the lower electrode 110.

In other words, by applying the DC voltage or the LF power from the DC power supply 130 or the potential-controlling high frequency power supply 140 to the auxiliary electrode 165, the potential difference between the wall of the processing chamber 100 and the plasmas ($V_{wall}-V_{plasma}$) can be controlled without changing the plasma generated in the processing chamber. Hence, it is possible to prevent the excessive erosion of the wall of the processing chamber 100 and the excessive adhesion of the film on the wall of the processing chamber 100.

(Specific Example of Consecutive Etching of Multilayer Film)

Figure 4A:
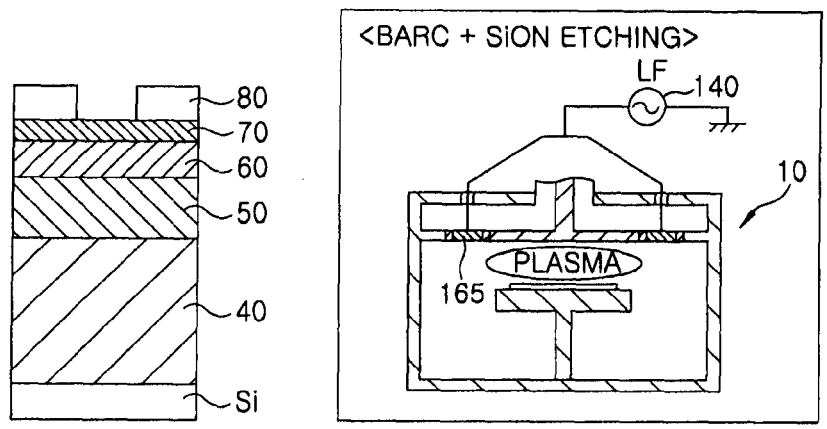
FIGS. 4A to 4C explain consecutive etching of a multilayer film structure by the etching apparatus in accordance with the first embodiment of the present invention.

Hereinafter, a specific example in which a plurality of different etching processes is consecutively performed on a multilayer structure in the same processing chamber by using the etching apparatus 10 of the present embodiment will be explained with reference to FIGS. 4A to 4C. Here, as shown in FIG. 4A, a $SiO_2$ film 40, an amorphous carbon film 50, a SiON film 60, a bottom anti-reflection coating (BARC) film 70, a resist film 80 are laminated on a silicon substrate Si in that order from the bottom.

(Etching of BARC Film+SiON Film)

In the consecutive etching of the multilayer film of this example, the BARC film 70 and the SiON film 60 are etched while using the resist film 80 as a mask. The process conditions at this time are set as follows:

Processing pressure: 100 mT;

Processing gas: $CF_4$ gas (Flow rate: 200 sccm);

High frequency power applied to the lower electrode 110 from the plasma-exciting high frequency power supply 150: 1000 W, 40 MHz;

High frequency power applied to the lower electrode 110 from the high frequency bias power supply 160: 0 W, 3 MHz.

In this process, the LF power is not applied to the lower electrode 110, so that the wall is not bombarded during the process. Hence, the film is easily deposited on the wall. To that end, the wall potential is increased by applying the LF power of the potential-controlling high frequency power supply 140 to the auxiliary electrode 165. Accordingly, the sputtering force on the wall is increased, thereby preventing the adhesion of the film on the wall.

(Etching of Amorphous Carbon Film a-Carbon)

Figure 4B:
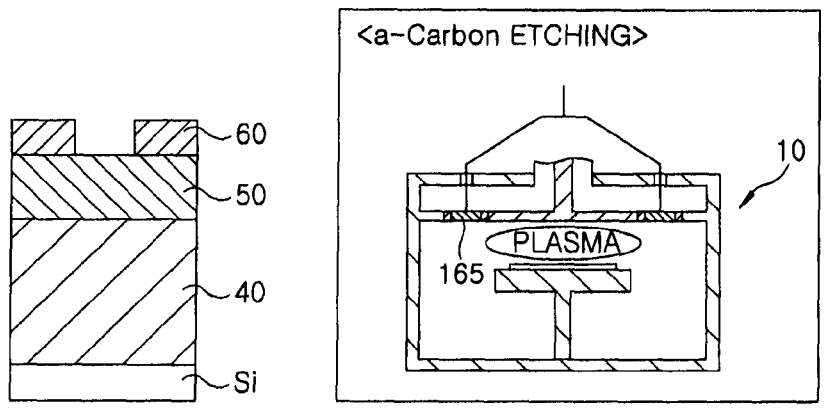

Then, the amorphous carbon (a-Carbon) film 50 shown in FIG. 4B is etched. The process conditions at this time are set as follows:

Processing pressure: 10 mT;
Processing gas: $O_2$ gas/COS gas (Flow rate: 400/20 sccm);
High frequency power applied to the lower electrode 110 from the plasma-exciting high frequency power supply 150: 1000 W, 40 MHz;
High frequency power applied to the lower electrode 110 from the high frequency bias power supply 160: 0 W, 3 MHz.

In this process, the LF power is not applied to the lower electrode 110, so that the wall is not bombarded. However, in this process, the gaseous mixture prevents the film from being adhered to the wall. In other words, in this etching, it is unnecessary to apply the power to the auxiliary electrode 165.

(Etching of $SiO_2$ Film)

Figure 4C:
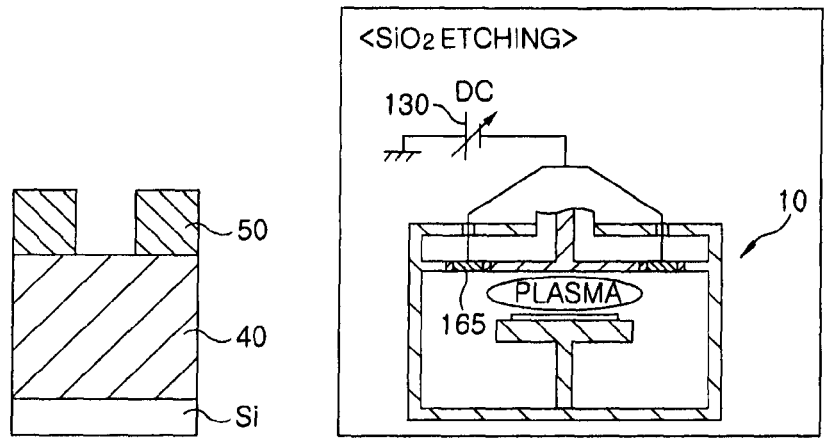

Next, the $SiO_2$ film 40 shown in FIG. 4C is etched. The process conditions at this time are set as follows:

Processing pressure: 30 mT;
Processing gas: $C_4F_6$ gas/$O_2$ gas/Ar gas (Flow rate: 70/70/200 sccm);
High frequency power applied to the lower electrode 110 from the plasma-exciting high frequency power supply 150: 1500 W, 40 MHz;
High frequency power applied to the lower electrode 110 from the high frequency bias power supply 160: 4500 W, 3 MHz.

In this process, the LF power of about 4500 W is outputted from the high frequency bias power supply 160, so that the wall is bombarded. Accordingly, the wall is eroded. To that end, the wall potential is decreased by applying the DC voltage to the auxiliary electrode 165. As a result, the sputtering force is decreased, and the erosion of the wall is prevented.

As described above, in the present embodiment, the connection of the auxiliary electrode 165 to the DC power supply 130 and the potential-controlling high frequency power supply 140 is switched before each of the consecutive etching processes of the multilayer film in the same processing chamber starts. Thus, the wall potential is controlled, and the particle generation or the adhesion of the film to the wall is suppressed. Accordingly, it is possible to prevent the excessive erosion of the wall and the excessive adhesion of deposits to the wall.

Especially, in a HARC (High Aspect Ratio Contact) process, a power having a lower frequency of 2 MHz is generally used as a high frequency bias power. Therefore, when the high frequency power applied to the lower electrode 110 is lower than or equal to about 500 W, polymers may be adhered, as shown in FIG. 2. Further, when the high frequency power is higher than or equal to about 1500 W, particles may be generated. Hence, it is preferable to switch the DC power supply 130 and the potential-controlling high frequency power supply 140 based on the above power level.

In other words, when the high frequency power applied from the high frequency bias power supply 160 is about 500 W or lower, the high frequency power is applied from the potential-controlling high frequency power supply 140 to the auxiliary electrode 165. When the high frequency power applied from the high frequency bias power supply 160 is higher than or equal to about 1500 W, a DC voltage is applied from the DC power supply 130 to the auxiliary electrode 165. Accordingly, in the process such as HARC or the like, even when the high frequency bias power having a lower frequency of 2 MHz is used as a high frequency bias power, it is possible to prevent the excessive erosion of the wall and the excessive adhesion of deposits on the wall.

When the high frequency power applied from the high frequency bias power supply 160 is higher than 500 W and lower than 1500 W, the particle generation and the polymer adhesion do not occur. Thus, in the above range, it is unnecessary to apply the power from the DC power supply 130 and the potential-controlling high frequency power supply 140 to the auxiliary electrode 165.

The application of the power from the DC power supply 130 and the potential-controlling high frequency power 140 is controlled when the high frequency power outputted from the plasma-exciting high frequency power supply 150 is set to be higher than or equal to about 200 W.

Second Embodiment

Figure 5:
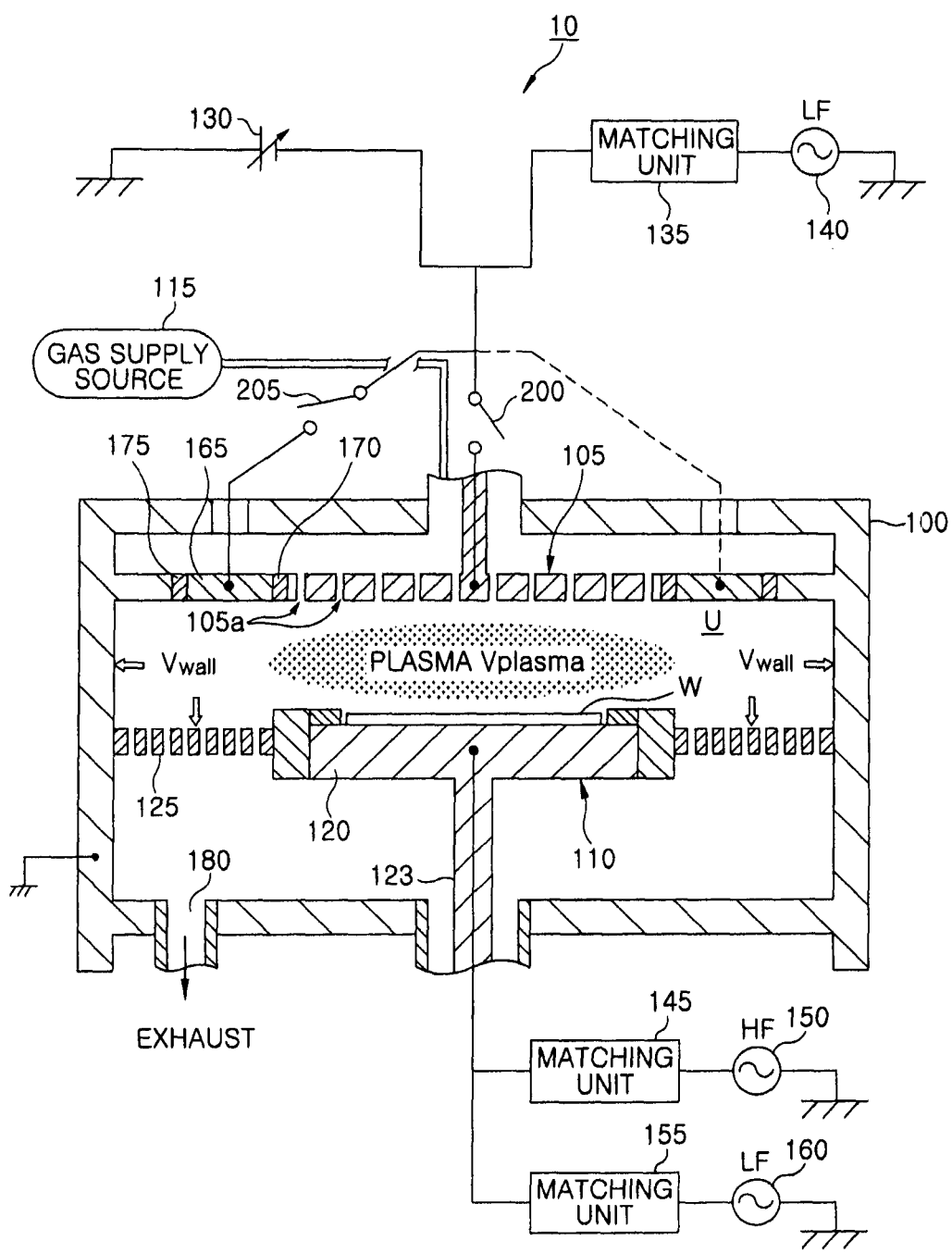
FIG. 5 is a vertical cross sectional view showing an entire configuration of an etching apparatus in accordance with a second embodiment of the present invention.

Hereinafter, an entire configuration of an etching apparatus in accordance with a second embodiment of the present invention will be described with reference to FIG. 5. The etching apparatus 10 of the second embodiment is different from that of the first embodiment in that the DC power supply 130 and the potential-controlling high frequency power supply 140 are connected to the upper electrode 105 and the auxiliary electrode 165. Therefore, only the difference will be described below, and the description on the configuration same as that of the first embodiment will be omitted.

The DC power supply 130 and the potential-controlling high frequency power supply 140 of the present embodiment are connected to the upper electrode 105 as well as the auxiliary electrode 165. A switch 200 is provided between the DC power supply 130 and the potential-controlling high frequency power supply 140 and the upper electrode 105. A switch 205 is provided between the DC power supply 130 and the potential-controlling high frequency power supply 140 and the auxiliary electrode 165.

The switches 200 and 205 are examples of a first switching mechanism for switching the supply destination of the high frequency power or the DC voltage from the potential-controlling high frequency power supply 140 or the DC power supply 130 between the auxiliary electrode 165 and the upper electrode 105 in accordance with the etching process conditions.

In the present embodiment, when a plurality of different etching processes is performed on a multilayer structure in the same processing chamber, the application of the power from the potential-controlling high frequency power supply 140 or the DC power supply 130 to the auxiliary electrode 165 and the application of the power from the potential-controlling high frequency power supply 140 or the DC power supply 130 to the upper electrode 105 are switched in accordance with the etching process conditions.

When the switch 205 is turned on while turning off the switch 200, the DC power supply 130 and the potential-controlling high frequency power supply 140 are connected to the auxiliary electrode 165 as in the first embodiment. Therefore, the control of the wall potential in accordance with the processes can be performed by using the DC power supply 130 and the potential-controlling high frequency power supply 140.

Meanwhile, when the switch 205 is turned off while turning on the switch 200, the DC power supply 130 and the potential-controlling high frequency power supply 140 are connected to the upper electrode 105. Hence, the plasma characteristics or the surface state of the upper electrode 105 can be controlled by using the DC power supply 130 and the potential-controlling high frequency power supply 140.

For example, when the high frequency power of a frequency lower than or equal to 13.56 MHz is applied from the potential-controlling high frequency power supply 140 to the upper electrode 105, the ions can be attracted toward the upper electrode 105 without affecting the generated plasma. In other words, by bombarding ions onto the surface of the upper electrode 105 which includes a portion made of silicon, the deposition of the film on the upper electrode 105 can be suppressed.

When the DC voltage is applied from the DC power supply 130 to the upper electrode 105, the attack of the ions on the upper electrode 105 is facilitated. Thus, the deposition of the polymer film on the upper electrode 105 can be suppressed.

Furthermore, when the DC voltage is applied from the DC power supply 130 to the upper electrode 105, only ions enter near the surface of the upper electrode 105. In general, electrons that contact the upper electrode 105 are annihilated. However, when the DC voltage is applied, the electrons do not approach near the surface of the upper electrode 105 and, thus, the consumption of the electrons on the surface of the upper electrode 105 can be suppressed. Accordingly, the plasma density can be increased. When the ions contact the metal material of the upper electrode 105, secondary electrons are emitted. Therefore, the beam of the electrons can be emitted toward the wafer W, which contributes to the processing of the wafer W.

As described above, in accordance with the present embodiment, the power supply destination of the DC power supply 130 and the potential-controlling high frequency power supply 140 is switched between the upper electrode 105 and the auxiliary electrode 165. When the power supply destination of the DC power supply 130 and the potential-controlling high frequency power supply 140 is the auxiliary electrode 165, the erosion of the wall and the deposition of deposits on the wall can be prevented by controlling the wall potential as in the first embodiment. On the other hand, when the power supply destination of the DC power supply 130 and the potential-controlling high frequency power supply 140 is switched to the upper electrode 105, the plasma characteristics or the surface state of the upper electrode 105 can be controlled by using the DC power supply 130 and the potential-controlling high frequency power supply 140.

In order to remove the films deposited on the upper electrode 105 and the wall, the DC voltage or the high frequency power is applied to both of the upper electrode 105 and the auxiliary electrode 165 by turning on both of the switches 200 and 205.

Third Embodiment

Figure 6:
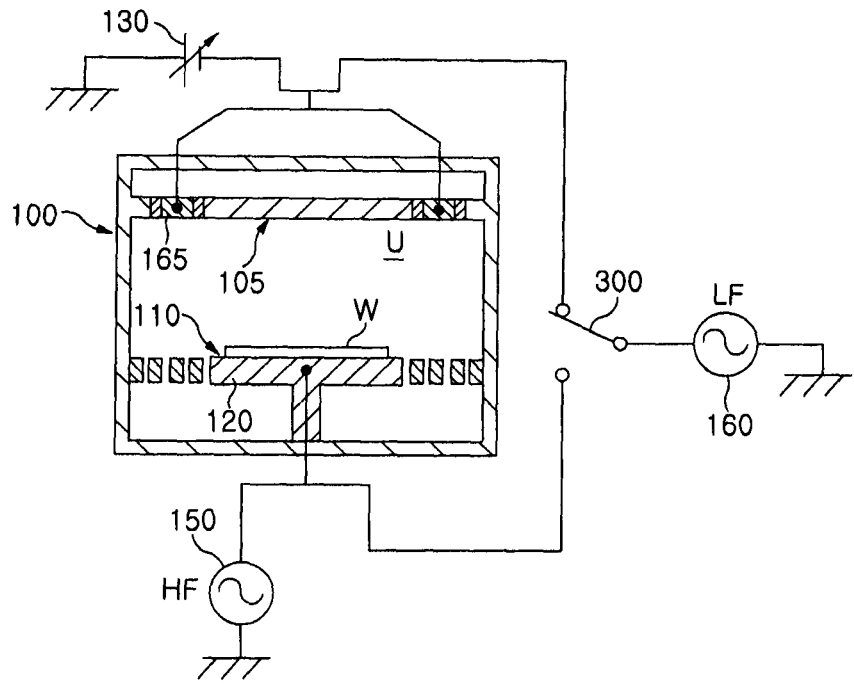
FIG. 6 explains a power supply switching operation using a switch.

Hereinafter, an entire configuration of an etching apparatus in accordance with a third embodiment of the present invention will be described with reference to FIG. 6. In the etching apparatus 10 of the third embodiment, the high frequency bias power supply 160 for applying a bias voltage to the lower electrode 110 also serves as the supply source of the high frequency power applied to the auxiliary electrode 165. In view of this, the third embodiment is different from the first embodiment in which the supply source of the high frequency power applied to the auxiliary electrode 165 (the potential-controlling high frequency power supply 140) is provided in addition to the high frequency bias power supply 160. Hence, only the differences will be described below, and the description on the configuration same as that of the first embodiment will be omitted.

The present embodiment is not provided with the potential-controlling high frequency power supply 140 of the first embodiment, and has only the high frequency bias power supply 160 connected to the auxiliary electrode 165 and the lower electrode 110. A switch 300 is provided between the high frequency bias power supply 160 and the auxiliary electrode 165. The switch 300 is an example of a second switching mechanism for switching the application of the high frequency power from the high frequency bias power supply 160 to the auxiliary electrode 165 and the application of the high frequency power from the same high frequency power supply 160 to the lower electrode 110.

In the present embodiment, when a plurality of different etching processes is consecutively performed on a multilayer structure in the same processing chamber, the application of the power from the high frequency bias power supply 160 to the auxiliary electrode 165 and the application of the power from the high frequency bias power supply 160 to the lower electrode 110 are switched in accordance with the etching process conditions.

When the switch 300 is connected to the auxiliary electrode 165, the high frequency bias power supply 160 and the auxiliary electrode 165 are connected to each other. Accordingly, the control of the wall potential in accordance with processes can be performed by using the DC power supply 130 and the high frequency bias power supply 160.

Meanwhile, when the switch 300 is connected to the lower electrode 110, the high frequency bias power supply 160 and the lower electrode 110 are connected to each other. As a consequence, the attraction of the ions toward the wafer W can be controlled by using the high frequency bias power supply 160. In this case, since the DC power supply 130 is connected to the auxiliary electrode 165, the control of the wall potential in accordance with processes; can be performed by using the DC power supply 130.

As described above, the present embodiment is provided with the switching mechanism for switching the power supply destination of the high frequency bias power supply 160 between the lower electrode 110 and the auxiliary electrode 165, so that the control of attraction of ions toward the wafer W and the control of the wall potential in accordance with processes can be performed only by using the conventional high frequency bias power supply 160.

Fourth Embodiment

Figure 7:
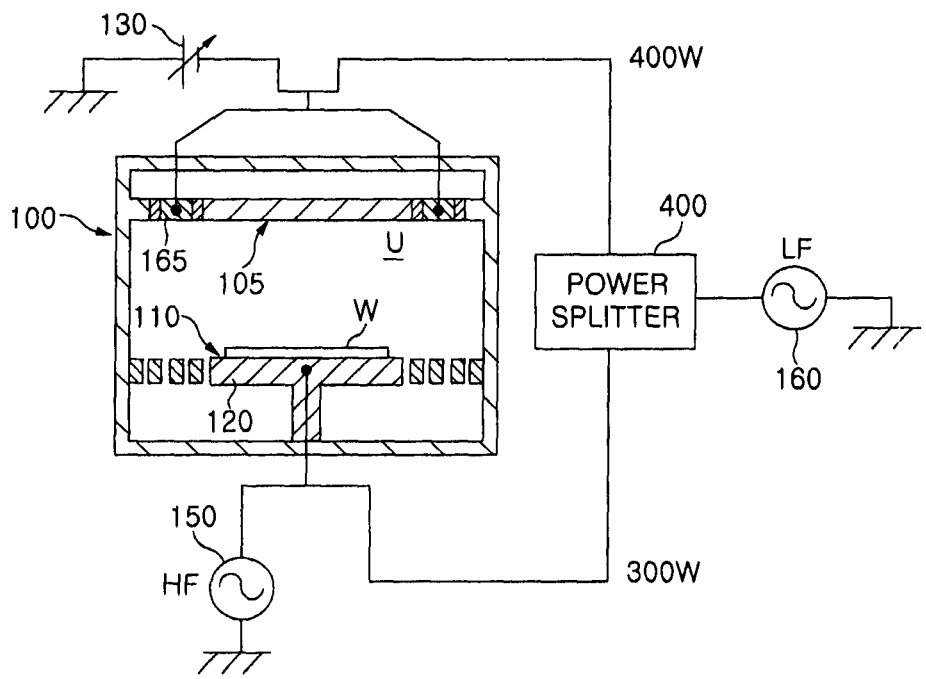
FIG. 7 explains power supply distribution using a power splitter.
Figure 8:
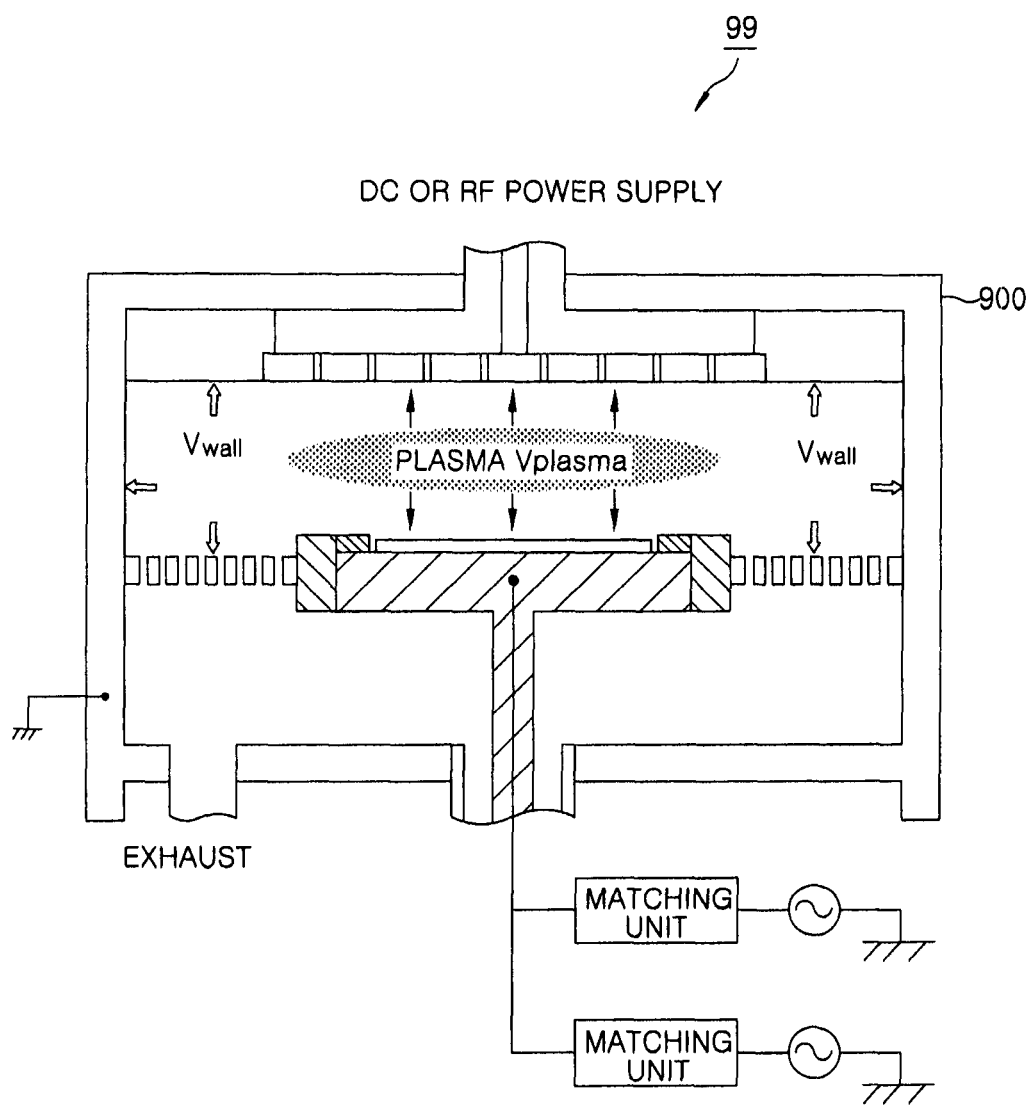
FIG. 8 explains a state of a potential in a plasma processing space.

Hereinafter, an entire configuration of an etching apparatus in accordance with a fourth embodiment of the present invention will be described with reference to FIG. 7. The etching apparatus 10 of the fourth embodiment is the same as that of the third embodiment in that the supply source of the high frequency power applied to the auxiliary electrode 165 also serves as the high frequency bias power supply 160 for applying a bias voltage to the lower electrode 110. However, in the fourth embodiment, a power splitter 400 is used to distribute power during power supply, which is different from the third embodiment in which the power supply destination is switched by the switch 300. Accordingly, only the differences will be described, and the description on the configuration same as that of the third embodiment will be omitted.

The present embodiment is not provided with the potential-controlling high frequency power supply 140, and has only the high frequency bias power supply 160 connected to the auxiliary electrode 165 and the lower electrode 110. The power splitter 400 is provided in a power line for connecting the high frequency bias power supply 160 to the auxiliary electrode 165 as well as to the lower electrode 110.

The power splitter 400 distributes differently the power applied from the high frequency bias power supply 160 to the auxiliary electrode 165 and to the lower electrode 110. For example, here, the power splitter 400 supplies the LF power of 300 W to the lower electrode 110 and the LF power of 400 W to the auxiliary electrode 165.

In accordance with the present embodiment, the power from the high frequency bias power supply 160 can be distributed and supplied to the lower electrode 110 and the auxiliary electrode 165. As a consequence, the control of the wall potential in accordance with processes and the control of the ion attraction toward the wafer W can be performed simultaneously only by using the conventional high frequency bias power supply 160.

As described above, the plasma processing method of the present embodiment can be carried out by using the etching apparatuses 10 of the above-described embodiments. Hence, in the batch etching of the multilayer structure, even if the step requiring an extremely high power condition and that requiring an extremely low power condition are consecutively performed in the same processing chamber, it is possible to prevent the excessive erosion of the wall and the excessive deposition of deposits on the wall by controlling the position of a control mechanism. As a result, it is possible to reduce the problems such as particles, contamination in the processing chamber, erosion of components, memory effect and the like.

While the invention has been shown and described with respect to the embodiments, it will be understood by those skilled in the art that various changes and modifications may be made without departing from the scope of the invention as defined in the following claims.

For example, the plasma processing apparatus of the present invention may have a third switching mechanism (not shown) for switching the application of the DC voltage from the DC power supply 130 to the auxiliary electrode 165 and the application of the high frequency power from the potential-controlling high frequency power supply 140 to the auxiliary electrode 165. Or, a filter (not shown) may be provided, instead of the third switching mechanism, at the downstream sides of the DC power supply 130 and the matching unit 135.

Moreover, in the plasma processing apparatus of the present invention, a control unit (not shown) is connected to the DC power supply 130 or the potential-controlling high frequency power supply 140. The control unit controls which of the DC power supply 130 and the potential-controlling high frequency power supply 140 applies the power to the auxiliary electrode 165. The control unit is connected to the switches 200 and 205 of FIG. 5 (the first switching mechanism), the switch 300 of FIG. 6 (the second switching mechanism), the third switching mechanism (not shown), or the power splitter 400 of FIG. 7, and controls the switching operation of the switching mechanism or the power distribution ratio.

In a general parallel plate type plasma processing apparatus, when a process requires a pressure of about 100 mT or less, a plasma is generated in an entire space. Meanwhile, when a process requires a pressure of about 100 mT or above, a plasma is generated at a side where the high frequency power is applied. Therefore, when the plasma-exciting high frequency power is applied to any one of the upper electrode and the lower electrode, especially when a process requires a pressure of about 100 mT or above, a plasma is generated near the electrode to which the high frequency power is applied. Accordingly, when the plasma-exciting high frequency power is applied to the upper electrode, the erosion of the wall or the adhesion of deposits on the wall can be more effectively controlled by applying the power to the auxiliary electrode of the above-described embodiments.

Meanwhile, when the plasma-exciting high frequency power is applied to the lower electrode without affecting the generated plasma, the effects of the above-described embodiments can be easily obtained.

The object to be plasma-processed by the plasma processing apparatus of the present invention is not limited to a silicon wafer, and may be a substrate for a FPD (Flat Panel Display), a substrate for a solar battery or the like.

As described above, in accordance with the present invention, a wall potential can be controlled properly in accordance with processes while maintaining a plasma in a stable state.

While the invention has been shown and described with respect to the embodiments, it will be understood by those skilled in the art that various changes and modifications may be made without departing from the scope of the invention as defined in the following claims.

What is claimed is:

1. A plasma processing apparatus for generating a plasma in a plasma processing space in a processing chamber and plasma-processing a target object, the plasma processing apparatus comprising:
a plasma-exciting high frequency power supply for applying a plasma-exciting high frequency power;
a potential-controlling high frequency power supply for applying a potential-controlling high frequency power having a frequency lower than that of the plasma-exciting high frequency power;
a DC power supply for applying a DC voltage;
a mounting table for mounting thereon the target object; and
an auxiliary electrode provided at a position outer side of the target object mounted on the mounting table while facing the mounting table, the auxiliary electrode being connected to the potential-controlling high frequency power supply and the DC power supply,
wherein the auxiliary electrode is arranged around an outer periphery of an upper electrode to be separated from the upper electrode,
wherein application of a high frequency power from the potential-controlling high frequency power supply to the auxiliary electrode and application of a DC voltage from the DC power supply to the auxiliary electrode are switched, and
wherein the plasma processing apparatus further comprises a switching mechanism for switching an apply destination of a high frequency power from the potential-controlling high frequency power supply and a DC voltage from the DC power supply between the auxiliary electrode and the upper electrode.

2. The plasma processing apparatus of claim 1, wherein a high frequency power applied from the plasma-exciting high frequency power supply is set to be higher than or equal to about 200 W.

3. The plasma processing apparatus of claim 1, wherein when a plurality of different etching processes is consecutively performed on a multilayer structure in the processing chamber, application of a high frequency power from the potential-controlling high frequency power supply to the auxiliary electrode and application of a DC voltage from the DC power supply to the auxiliary electrode are switched in accordance with each etching process condition.

4. The plasma processing apparatus of claim 1, wherein the switching mechanism, switches the apply destination when a plurality of different etching processes are consecutively performed on a multilayer structure in the processing chamber.

5. The plasma processing apparatus of claim 1, wherein the auxiliary electrode is made of metal or a material including silicon.

6. The plasma processing apparatus of claim 1, wherein a wall of the processing chamber includes a member obtained by thermally spraying an insulating material on an aluminum base, or a member obtained by coating silicon carbide on a silicon or an aluminum base.

* * * * *